(12) United States Patent
Wallner et al.

(10) Patent No.: US 7,633,814 B2
(45) Date of Patent: Dec. 15, 2009

(54) MEMORY DEVICE AND METHOD OF OPERATING SUCH

(75) Inventors: Paul Wallner, Prien (DE); Stefan Dietrich, Tuerkenfeld (DE); Peter Gregorius, Munich (DE)

(73) Assignee: Qimonda AG, Munich (DE)

( * ) Notice: Subject to any disclaimer, the term of this patent is extended or adjusted under 35 U.S.C. 154(b) by 114 days.

(21) Appl. No.: 11/735,928

(22) Filed: Apr. 16, 2007

(65) Prior Publication Data
US 2007/0247929 A1    Oct. 25, 2007

(30) Foreign Application Priority Data
Apr. 15, 2006   (DE) ................ 10 2006 017 768

(51) Int. Cl.
*G11C 16/04* (2006.01)
(52) U.S. Cl. ............... 365/189.05; 365/233.1; 365/233.11
(58) Field of Classification Search ............ 365/189.05, 365/233.1, 236, 233.11, 219–221, 189.02
See application file for complete search history.

(56) References Cited

U.S. PATENT DOCUMENTS

| | | | |
|---|---|---|---|
| 5,835,936 A * | 11/1998 | Tomioka et al. ............ 365/219 |
| 6,125,078 A | 9/2000 | Ooishi et al. | |
| 6,324,096 B1 * | 11/2001 | Tomita ................ 365/185.05 |
| 6,366,529 B1 * | 4/2002 | Williams et al. ........... 365/239 |
| 7,102,949 B2 * | 9/2006 | Fujioka et al. ............. 365/222 |

OTHER PUBLICATIONS

JEDEC Standard, Double Data Rate (DDR) SDRAM Specification, JESD79D, (Revision of JESD79C), JEDEC Solid State Technology Association, 2500 Wilson Boulevard, Arlington, VA 22201-3834, Jan. 2004, p. 1 and 5.
128/144-Mbit RDRAM Datasheet (32 Split Bank Architecture), Preliminary Information Version 1.11, Rambus Inc., 2465 Latham Street, Mountain View, California, USA, 94040, 2000, p. 1 and 4.

* cited by examiner

*Primary Examiner*—David Lam
(74) *Attorney, Agent, or Firm*—Patterson & Sheridan, L.L.P.

(57) ABSTRACT

A memory device comprising a memory cell array; an input circuit for receiving command data and providing drive signals to the memory cell array; an output buffer for buffering data read out from the memory cell array; and a timer for driving the output buffer such that the buffered data are provided at an output after a predetermined time interval has elapsed, the predetermined time interval beginning with the provision of the drive signals.

35 Claims, 8 Drawing Sheets

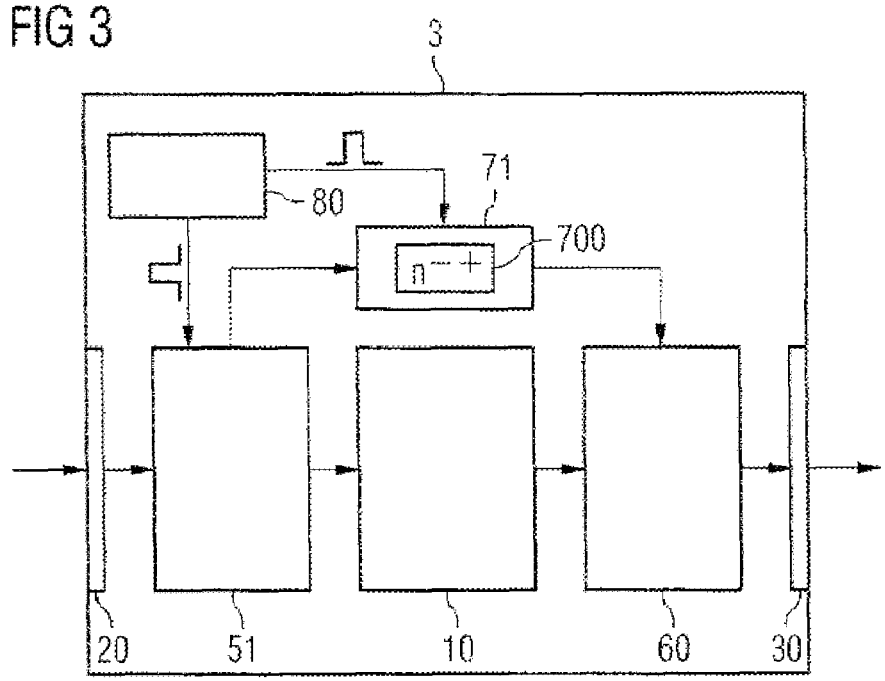
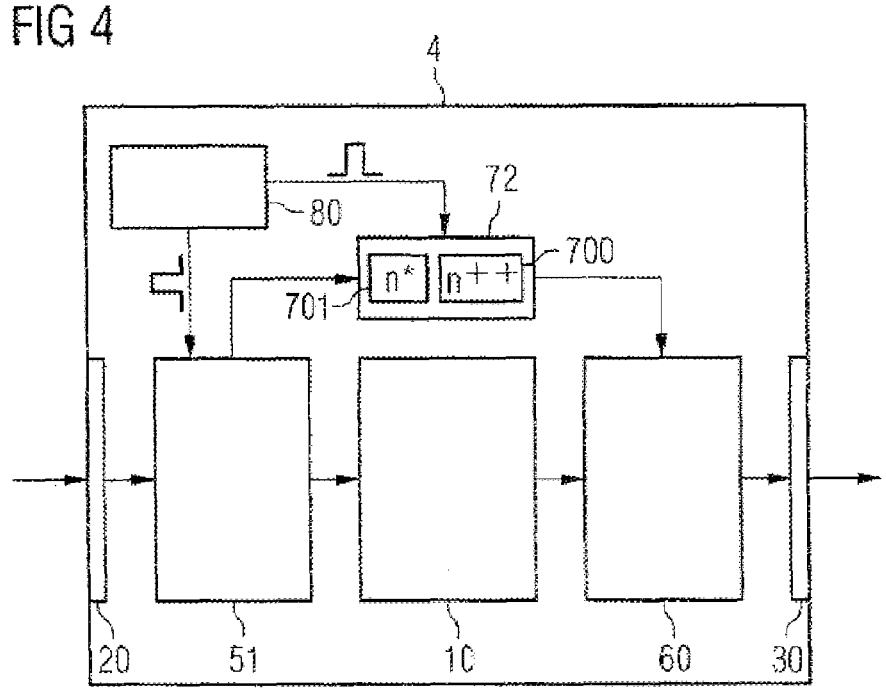

MEMORY DEVICE AND METHOD OF OPERATING SUCH

CROSS-REFERENCE TO RELATED APPLICATIONS

This application claims foreign priority benefits under 35 U.S.C. §119 to co-pending German patent application number DE 10 2006 017 768.1-55, filed 15 Apr. 2006. This related patent application is herein incorporated by reference in its entirety.

BACKGROUND OF THE INVENTION

Modern computer systems and data processing systems make high demands on the data memories used therein. The memories should be capable of providing extensive data within a short access time. Fast data memories meeting these demands are data memories with electronic integrated memory devices such as, for example, so-called DRAM (Dynamic Random Access Memory) devices.

Often, however, memory capacities are demanded which cannot be met by a single device. A number of integrated memory devices are therefore embedded in a high-capacity memory system in a conventional manner. The individual integrated memory device should therefore cooperate with memory controllers and/or other memory devices in order to ensure interference-free and time-efficient coordination of the data flow.

In conventional memory systems comprising a number of integrated memory devices or memory devices, a read request, for example, is delivered to all memory devices, to a group of memory devices or to an individual memory device, where the corresponding memory device then delivers the requested data after a so-called latency period after receiving the read request. The latency period is thus defined here in the sense of the time interval from the delivery of a read request to the reception of the requested data. The memory systems comprise a number of individual memory devices which are produced in high numbers with the aid of complex and highly developed production processes.

In spite of the high and optimized reproducibility of established production processes, it is impossible to produce identical devices. Instead, the individual devices are subject to process-related variances which are mainly noticeable with regard to a latency period varying from device to device.

Furthermore, fluctuations in the supply voltage and the environmental temperature also lead to a change in the latency period during the operation. The variances are also collectively referred to as PVT (Process Voltage Temperature) variances. The time interval between the request and receiving the data thus varies and cannot be adjusted precisely.

The varying latency period of conventional memory devices leads to certain restrictions with regard to the time efficiency in the interaction of a number of memory devices. for example, to increase the number of integrated memory devices in a memory system—and thus also the total memory capacity—whilst simultaneously minimizing access time, the individual integrated memory device should be capable of reliably providing the requested data after a well defined access time which is constant over the entire operation. Additionally, if a number of memory devices use a common data bus for outputting the data, as for example in a cascaded circuit, it becomes necessary that the individual memory device inserts the data into a data stream at a well defined and determinable time. Otherwise, collisions arise when a memory device outputs data at a time at which data signals are already present at the location of the signal entry. Furthermore, too generous a waiting time between two successive read requests leads to under-utilization of the signal paths.

SUMMARY OF THE INVENTION

Various embodiments of the present invention may provide particular advantages for an improved method of fabricating a functional layer and an improved method of fabricating an integrated device.

For one embodiment of the present invention, a memory device comprises a memory cell array; an input circuit, the input circuit receiving command data and providing drive signals to the memory cell array; an output buffer, the output buffer buffering data read out from the memory cell array; and a timer, the timer driving the output buffer such that the buffered data are provided at an output after a predetermined time interval has elapsed, the predetermined time interval beginning with the provision of the drive signals.

For one embodiment of the present invention, a memory module comprises at least two memory devices, the memory devices EA each comprising a memory cell array; an input circuit, the input circuit receiving command data and providing drive signals to the memory cell array; an output buffer, the output buffer buffering data read out from the memory cell array; and a timer, the timer driving the output buffer such that the buffered data are provided at an output after a predetermined time interval has elapsed, the predetermined time interval beginning with the provision of the drive signals.

For one embodiment of the present invention, a method of operating a memory device comprises providing command data; providing drive signals to a memory cell array, the drive signals depending on the command data; buffering data read out from the memory cell array; and outputting the buffered data to an output after a predetermined time interval has elapsed, the predetermined time interval beginning with the provision of the drive signals.

According to an embodiment of the present invention, an integrated memory device is provided which will be described in greater detail in the text which follows. Firstly, the integrated memory device comprises a memory cell array for reading out data. An input circuit receives command data and provides drive signals for the memory cell array. By providing drive signals, data can be read out of the memory cell array. The integrated memory device also comprises an output buffer for buffering data read out of the memory cell array, and a timer. The timer drives the output buffer in such a manner that the buffered data are output at an output at a predetermined time interval after the provision of the drive signal.

By providing an output buffer and a timer, the integrated memory device according to an embodiment of the invention allows data read out of the memory cell array to be buffered at the time when they are read out of the memory cell array and to be provided at an output only after a predetermined time interval has elapsed after the request. For this purpose, command data are first received from an input circuit and converted into drive signals for the memory cell array. This conversion is independent of the memory cell array and, therefore, always takes the same length of time, according to one embodiment.

The timer records the provision of the drive signals and can thus determine the beginning of the predetermined time interval. Starting with the provision of the drive signals, the data to be read out are read out of the memory cell array and provided after the latency period. This effective access time given by the latency period is subject to the PVT (Process Voltage Temperature) variance, already mentioned above, which is due to production and environmental conditions. As a rule, these are not predictable or controllable but an upper time limit can often be specified for these. As soon as the data read out are provided by the memory cell array, they are buffered in the output buffer. However, the timer only causes the output buffer to forward the data read out to the output after the predetermined time interval has elapsed after the request of the read data. According to an embodiment of the invention, it is thus ensured that the integrated memory device has a well defined and constant-time latency period. The predetermined time interval is such that it also covers maximum PVT variance and it may be ensured that the data, before they are forwarded to the output, are written into the output buffer by the memory cell array in every case.

According to another embodiment of the present invention, a method of operating a memory device, particularly an integrated memory device described above, is provided. The method according to this embodiment includes first providing command data. Following this, a drive signal for a memory cell array in dependence on the command data is provided. This is followed by buffering of data read out of the memory cell array. Finally, the buffered data are output to an output after a predetermined time interval has elapsed after the provision of the drive signal. The requested data may thus be available at an output a well defined and constant period after having been requested. The interaction of a number of integrated memory devices may thus be made time-efficient.

According to an embodiment of the present invention, the input circuit comprises a paralleling unit for parallelizing serial command data. The input circuit receives the command data and thereupon provides the drive signals for the memory cell array. The memory cell array, usually comprising memory cells arranged in rows and columns, may need paralleled drive signals for selecting the corresponding cells. Providing a paralleling unit therefore also enables the command data to be provided in serial form and may thus reduce the number of required feed lines of the memory device to a minimum.

According to a further embodiment of the present invention, the input circuit comprises a protocol unit for decoding the command data. The protocol unit is capable of decoding command data embedded in a protocol in order to provide the drive signals. The embedding of the command data in a protocol according to the invention may allow a virtually unlimited width of the command structure largely with independence from hard-wired address, control and data lines.

According to a further embodiment of the present invention, the input circuit has a transfer unit for forwarding the command data to a further output. This may enable the memory device to provide the received command data to further components—such as, for example, a further memory device, which may be arranged on a common module.

According to a further embodiment of the present invention, the memory device has a further input and a further transfer unit. The further input receives user data and the further transfer unit forwards these user data to the output. This enables the memory device to forward user data, read out, for example, from other memory devices, and also enables a number of memory devices to be cascaded.

According to a further embodiment of the present invention, the output buffer comprises a FIFO buffer. Such a FIFO (First In First Out) buffer may be capable of buffering also a number of received data records and to output these on request without disturbing the original order of the data read out.

According to a further embodiment of the present invention, the output buffer comprises a demultiplexer and at least two buffer registers. The demultiplexer forwards the data read out to one of the at least two buffer registers in dependence on an input pointer. Providing at least two buffer registers may allow data read out to be buffered again even if the data previously read out have not yet been output. The demultiplexer distributes the data to the corresponding buffer register and is controlled by the input pointer.

According to a further embodiment of the present invention, the output buffer comprises a control unit for providing the input pointer. The input pointer is changed in dependence on a ready signal which is provided by the memory cell array. The ready signal of the memory cell array signals the arrival of the requested data which must now be buffered in the output buffer. Depending on this ready signal, the control unit changes the input pointer and selects a next free buffer register for buffering the data provided.

According to a further embodiment of the present invention, the timer comprises a further control unit for providing an output pointer for the buffer registers. In this arrangement, the buffer registers forward the buffered data to the output in dependence on the output pointer. The output pointer determines which buffer register outputs the buffered data. The timer may comprise for this purpose the further control unit for providing this output pointer in order to cause the corresponding buffer register to output the buffered data after the predetermined time interval has elapsed.

According to a further embodiment of the present invention, the timer comprises a further control unit for providing the input pointer for the demultiplexer and for providing the output pointer for the buffer registers. The timer may control, by means of the further control unit, both the demultiplexer at the input end of the output buffer and the buffer registers for outputting the buffered data at an output. This embodiment allows the output buffer to be controlled entirely by only one further control unit of the timer.

According to a further embodiment of the present invention, the input circuit is arranged in such a manner that it provides the drive signal synchronously with a first clock signal. By this means, the time at which the drive signal is delivered can be advantageously determined in a well defined manner by an edge of the first clock signal.

According to a further embodiment of the present invention, the timer comprises a counter for counting clock cycles of a second clock signal after the provision of the drive signal. The predetermined time interval can thus be defined by a number of clock cycles of the second clock signal and the timer can determine the progress of the predetermined time interval by simply counting clock cycles. The memory device may comprise a synchronizing unit for synchronizing the first and the second clock signal in respect to frequency and phase. According to one embodiment, provision of such a synchronizing unit does away with the additional waiting time for compensating for a phase shift between the first and the second clock signal. The predetermined time interval can thus be determined by the lowest possible number of clock cycles and by counting these clock cycles. This makes it possible to optimize the time efficiency and the effective access time of the memory device.

According to a further embodiment of the present invention, the timer is arranged in such a manner that it detects that the predetermined time interval has elapsed on reaching a maximum value of the counter. The predetermined time interval can thus be defined clearly and in a simple manner by setting the maximum value. Furthermore, the timer can have a register in which the maximum value is stored.

BRIEF DESCRIPTION OF THE DRAWINGS

These above recited features of the present invention will become clear from the following description, taken in conjunction with the accompanying drawings. It is to be noted, however, that the accompanying drawings illustrate only typical embodiments of the present invention and are, therefore, not to be considered limiting of the scope of the invention. The present invention may admit equally effective embodiments.

FIG. 3 diagrammatically shows a memory device according to a third embodiment of the present invention;

FIG. 4 diagrammatically shows a memory device according to a fourth embodiment of the present invention;

DETAILED DESCRIPTION OF THE PREFERRED EMBODIMENT

Figure 1:
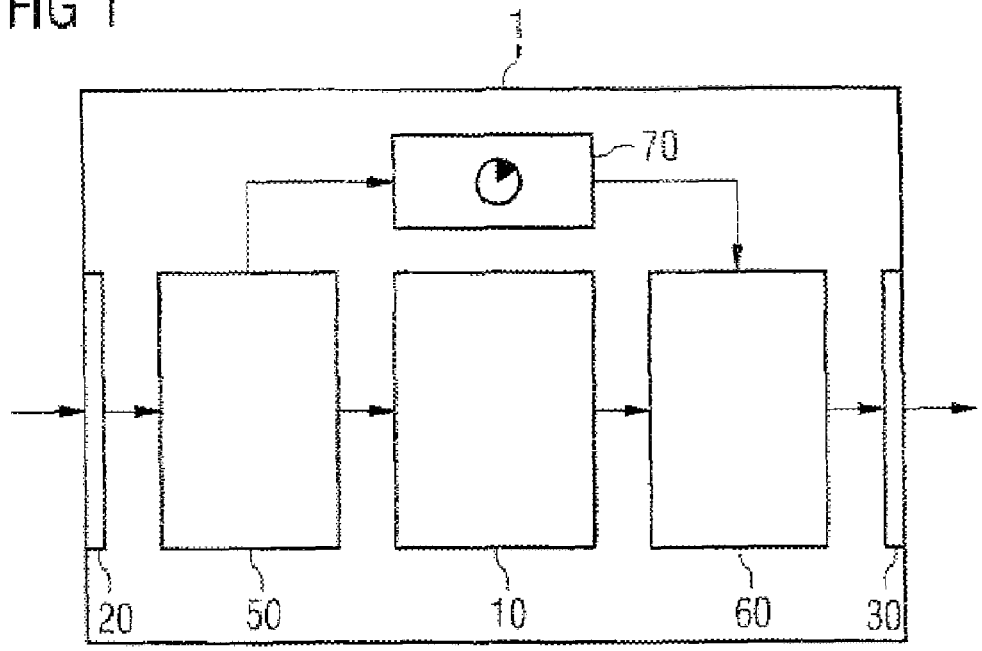
FIG. 1 diagrammatically shows a memory device according to a first embodiment of the present invention.

FIG. 1 diagrammatically shows a memory device 1 comprising a memory cell array 10. The memory cell array 10 stores the data of the memory device in memory cells, wherein a single memory cell can assume two or more logic states.

The memory device 1 comprises an input 20 for receiving command data. These command data are available in the form of electrical signals at the input 20. The command data control the memory device 1 and are thus used for requesting data to be read out from the memory cell array, for instance. Furthermore, the memory device 1 comprises an input circuit 50 for receiving the command data from the input 20. The input 20 or the input circuit 50 can also have means for signal processing such as, for example, amplifiers or passive elements. The input circuit 50 provides drive signals in dependence on the command data for the memory cell array 10 which cause the memory cell array 10 to read out corresponding memory cells. The memory cell array 10 then writes these data read out to an output buffer 60 at the output.

In this arrangement, the memory cell array 10 comprises a so-called latency period which is composed of a nominal latency period and a maximum PVT variance. The nominal latency period is given by the finite time needed by the memory cell array 10 for providing the data read out at its output after receiving the drive signals. The PVT (Process Voltage Temperature) variance is the variable unpredictable period of time which varies due to, among other things, the production process. Furthermore, fluctuations in the operating voltage and the operating temperature lead to a different access time of the memory cell array 10.

According to an embodiment of the invention, the predetermined time interval, for which a timer 70 waits from the provision of the drive signals to driving an output buffer 60, comprises both the nominal latency period and an upper limit of a maximum PVT variance to be expected. This ensures that the data to be read out are available in every case in the output buffer 60 at an output 30 at the time when they are output from the output buffer 60.

The timer 70 receives at its input drive signals from the input circuit 50 and, as a result, can determine the time of delivery of the drive signals of the input circuit 50 to the memory cell array 10 and thus the beginning of the predetermined time interval. After the predetermined time interval has elapsed, the timer 70 delivers a further drive signal to the output buffer 60 which thereupon outputs the data read out and buffered to the output 30. In this process, the output buffer 60 reads in the data from the memory cell array 10 at the time when they are provided, stores them and forwards them to the output 30 on request.

Figure 2:
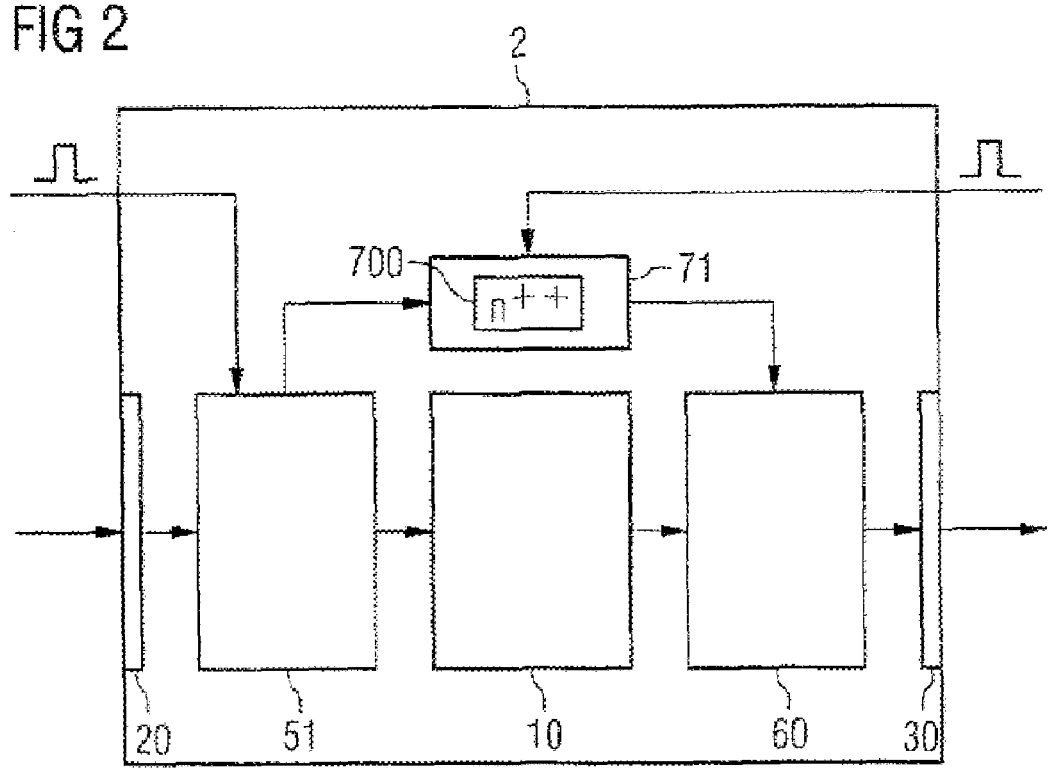
FIG. 2 diagrammatically shows a memory device according to a second embodiment of the present invention.

FIG. 2 shows a memory device 2 which is developed according to a second embodiment of the present invention. Accordingly, the memory device 2 has a timer 71 with a counter 700. Furthermore, the memory device 2 comprises an input circuit 51 which receives at its input both the command data from the input 20, and a first clock signal. At its output, the input circuit 51 again provides from the command data drive signals for the memory cell array 10. Furthermore, these drive signals for the memory cell array 10 and the timer 71 are delivered synchronously with the first clock signal. After delivering the drive signal, the timer 71 counts the clock cycles of a second clock signal in order to thus wait for the predetermined time interval in units of clock cycles of the second clock signal.

FIG. 3 shows a memory device 3 comprising a clock generator 80. The clock generator 80 both delivers the first clock signal to the input circuit 51 and the second clock signal to the timer 71. The clock generator 80 may synchronize the two clock signals in such a manner that they are provided both frequency- and phase-synchronously to the input circuit 51 and to the timer 71. The clock generator 80 can also receive externally one or more clock signals from outside the memory device. In this case, the operation of the clock generator 80 can then be restricted to signal processing and possible synchronization of the received clock signals.

The frequency- and phase-synchronous provision of the clock signals can be implemented by a phase-locked loop (PLL) and/or delay-compensated clock signal lines. If the clock signals are present frequency- and phase-synchronously at the input circuit 51 and at the timer 71, the input circuit 51 can forward the drive signal synchronously with the clock signal to the timer 71 which can then determine the predetermined time interval without phase delay in clock cycles of the clock signal provided to it by means of the counting unit 700.

FIG. 4 shows a memory device 4 according to a fourth embodiment of the present invention. As shown there, a timer 72 comprises, in addition to the counter 700, also a register 701 which can store a maximum value n*. Due to the frequency and phase synchronization of the clock signals which are provided by the clock generator 80, the predetermined time interval only needs to comprise the nominal latency period and a maximum PVT variance of the memory cell array 10. Any phase shift between the clock signals which are in each case provided to the input circuit 51 and the timer 72 no longer needs to be taken into consideration due to the frequency- and phase-synchronous generation of the clock signals. A corresponding minimized maximum value n* can thus be stored in the register 701. The memory device 4 according to this embodiment of the invention can therefore be operated reliably and in an optimized manner.

Figure 5:
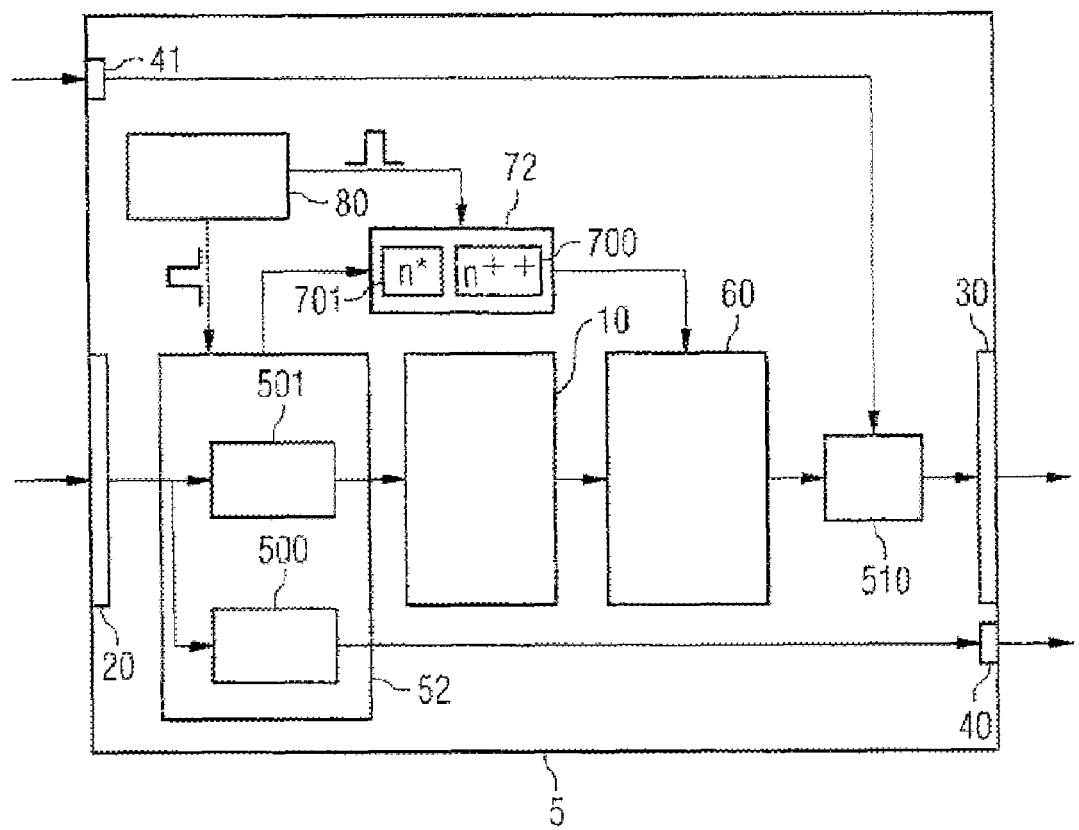
FIG. 5 diagrammatically shows a memory device according to a fifth embodiment of the present invention.

FIG. 5 shows a memory device according to a fifth embodiment of the present invention. Accordingly, an input circuit 52 comprises a transfer unit 500 and a protocol unit 501. Using the protocol unit 501, the input circuit 52 decodes the command data received by the input 20 for providing the drive signals for the memory cell array 10. Providing a protocol unit 501 according to an embodiment of the invention may allow the command data to be embedded in a protocol. Thus, scarcely any limits are set with regard to the extent and complexity of the commands which can be used, and the input circuit 52 also may allow, apart from regularly addressing the memory cell array 10, ongoing commands to be decoded such as, for example, direct addressing of the clock generator 80 or the timer 72.

The input circuit 52 also comprises a transfer unit 500 for forwarding the command data to a further output 40. Thus, the command data provided to the input 20 of the memory device 5 can also be forwarded to other memory devices and/or components. Furthermore, the memory device 5 comprises a further transfer unit 510 for forwarding useful data from a further input 41 to the output 30. The memory device 5 thus may allow external data to be forwarded which, for example, come from a further memory device, and thus also the cascading of a number of memory devices. Furthermore, the further transfer unit 510 can insert the data read out of the memory cell array 10 with bit-accuracy, i.e. without risk of a data collision and with optimum time-efficient utilization of the signal paths, into a data stream which extends from the further input 41 via the further transfer unit 510 to the output 30 within the memory device. Providing a transfer unit 500, a further input 41, a further output 30 and a further transfer unit 510 can also be done in combination with other embodiments of the present invention.

Figure 6:
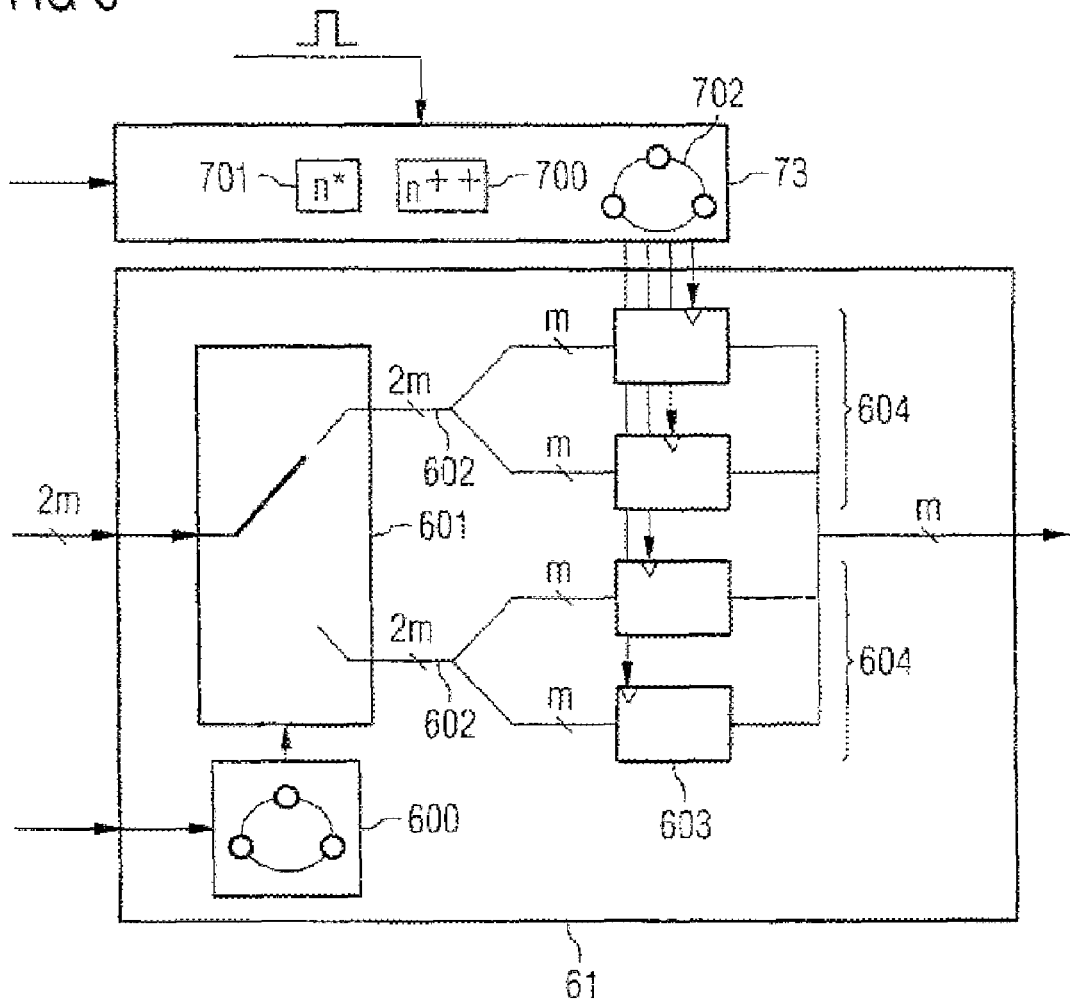
FIG. 6 diagrammatically shows a clock generator and an output buffer according to a sixth embodiment of the invention.

FIG. 6 shows an output buffer 61 and a timer 73 according to a sixth embodiment of the present invention. Accordingly, the output buffer 61 comprises a demultiplexer 601 for distributing data read out of the memory cell array 10 to a number of outputs 602 of the demultiplexer. The demultiplexer 601 can thus distribute the data read out of the memory cell array 10 to a number of buffer registers 603. In this arrangement, the data read out with an initial data width of 2 m can be distributed—as shown here—to a number of buffer registers 603 having the data width m. The respective output 602 of the demultiplexer 601 is determined by an input pointer which is provided to the demultiplexer 601 by a control unit 600. For this purpose, the control unit 600 can accept, for example, a ready signal of the memory cell array 10 which signals the availability of the data read out, and then change the input pointer correspondingly for the demultiplexer 601.

According to this embodiment of the invention, at least two register groups 604 comprising two buffer registers 603 each are provided in order to enable the output buffer to retain buffered data even though new data are already present from the memory cell array. For this case—only to be considered as an example—a register group 604 is capable of storing the data read out of the memory cell array 10 in full width, in this case 2 m, wherein a register group 604 then distributes these data internally to two buffer registers 603 having in each case the data width m.

According to this embodiment of the present invention, the timer 73 also comprises a further control unit 702 which drives the buffer registers 603 in accordance with the predetermined time interval. The time of this drive is determined with the aid of the count of the counter 700 in comparison with the maximum value n* which is stored in the register 701. Starting with the provision of the drive signals for the memory cell array 10, the buffer registers 603 are thus driven in such a manner that the buffered data are delivered in the form of a first and of a second word—in this case having a data width m in each case—to the output 30. Within the predetermined time interval, the timer will thus cause two of the buffer registers 603 to output the buffered data stored in them.

Figure 7:
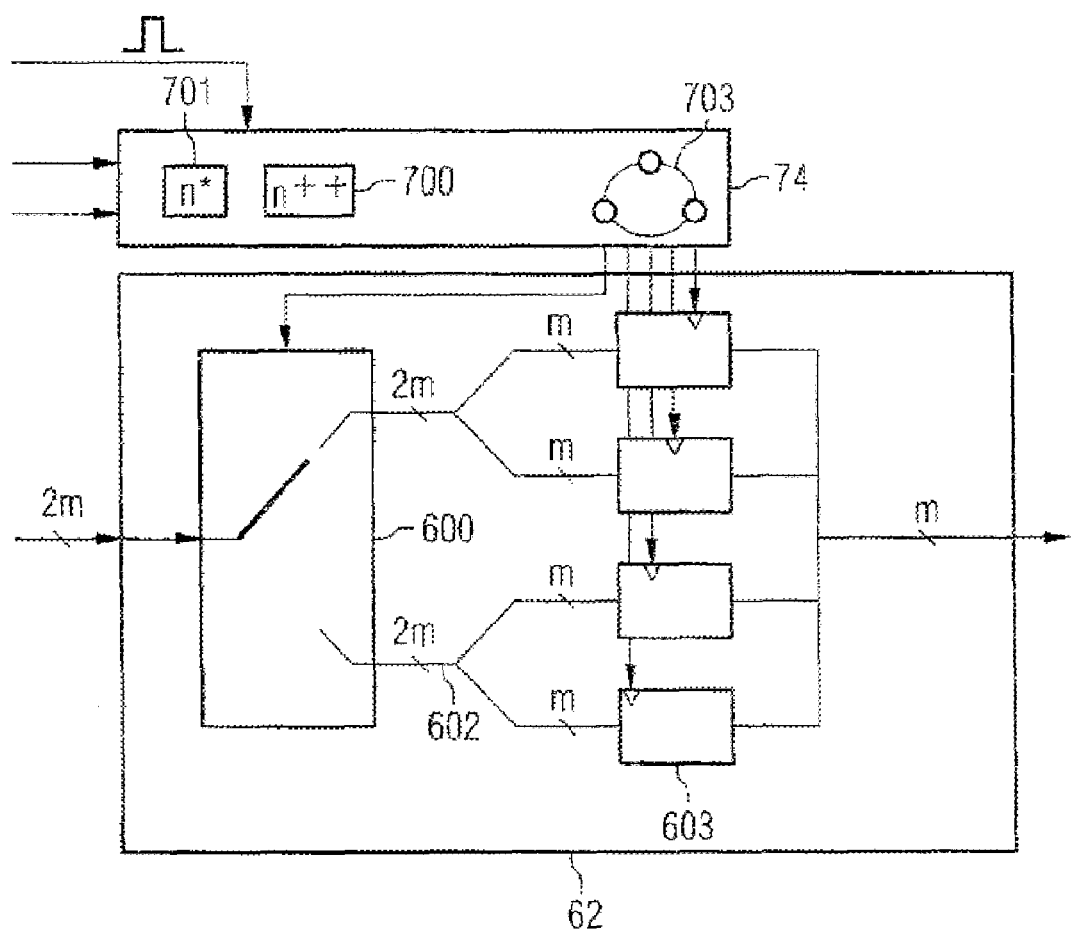
FIG. 7 shows a clock generator and an output buffer according to a seventh embodiment of the present invention.

FIG. 7 shows an output buffer 62 and a timer 74 according to a seventh embodiment of the present invention. Accordingly, the timer 74 has a further control unit 703 which controls both the demultiplexer 600 and the buffer registers 603 of a output buffer 62. For this purpose, the timer 74 receives both at least one drive signal for the memory cell array and a ready signal which signals the availability of the data read out of the memory cell array 10.

Figure 8:
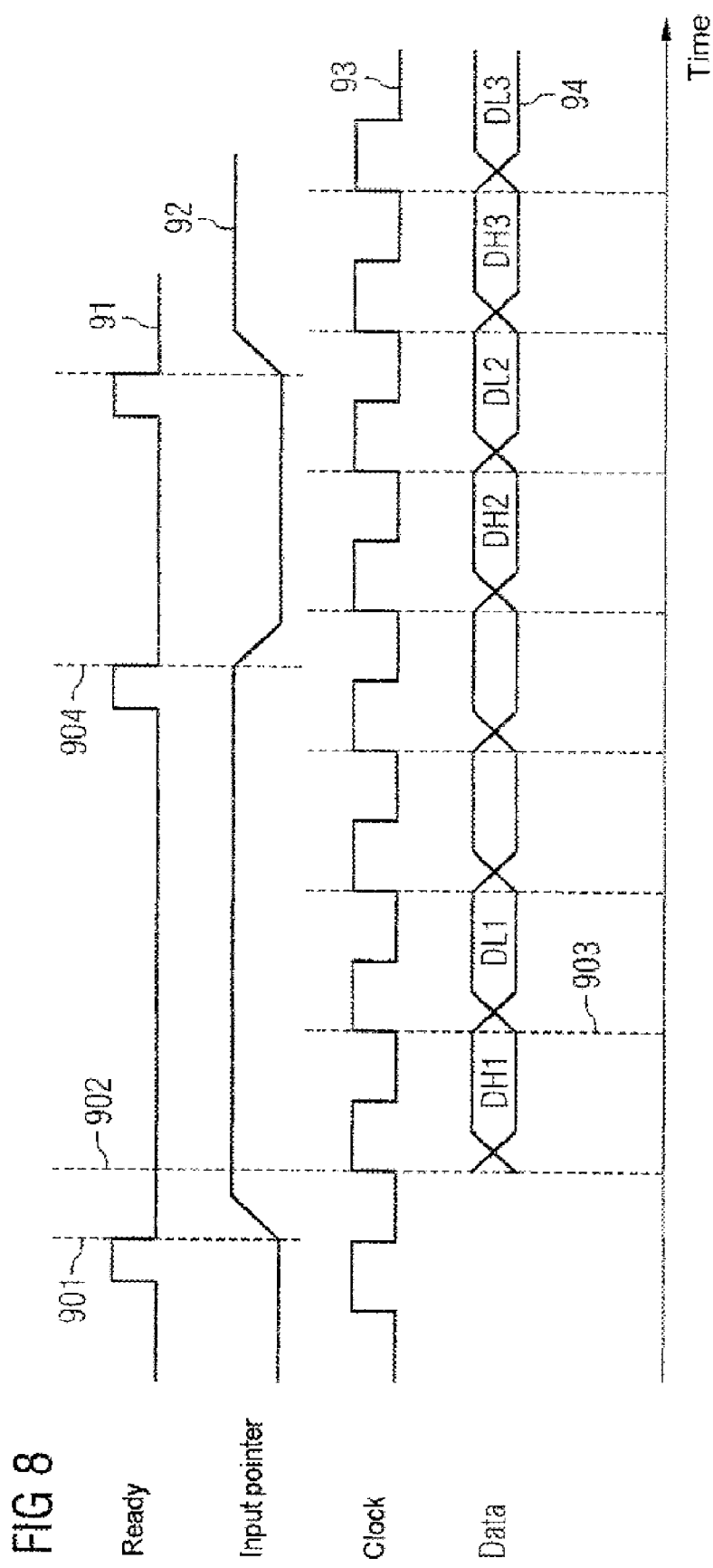
FIG. 8 diagrammatically shows a signal level variation with time according to an eighth embodiment of the present invention.

FIG. 8 diagrammatically shows the signal level variation with time according to an eighth embodiment of the present invention, particularly as can be used in a memory device according to the sixth embodiment of the present invention. A ready signal 91 initially signals the availability of the requested data from a memory cell array. A falling edge of the ready signal 91 causes an input pointer 92 to be switched over at a time 901. As shown here, the input pointer signal 92 can assume two states—one in each case for one buffer register. Thus, the input pointer is only changed in dependence on the ready signal 91 of the memory cell array.

At a time 902, the first rising edge of a clock signal 93 after the provision of the data causes a first high-value data word DH1 to be output. Since the data were written into the buffer registers in double word widths starting from time 901, the low-value data word DL1 is output at time 903, for example, with the subsequent rising edge of the clock signal 93. The availability of the next data from the memory cell array is signalled by the next falling edge of the ready signal 91 at a time 904. The input pointer 92 thereupon jumps over and an analogous data output sequence of the data signal 94 follows for the words DH2 and DL2. The data are again output synchronously with a rising edge of the clock signal 93.

Figure 9:
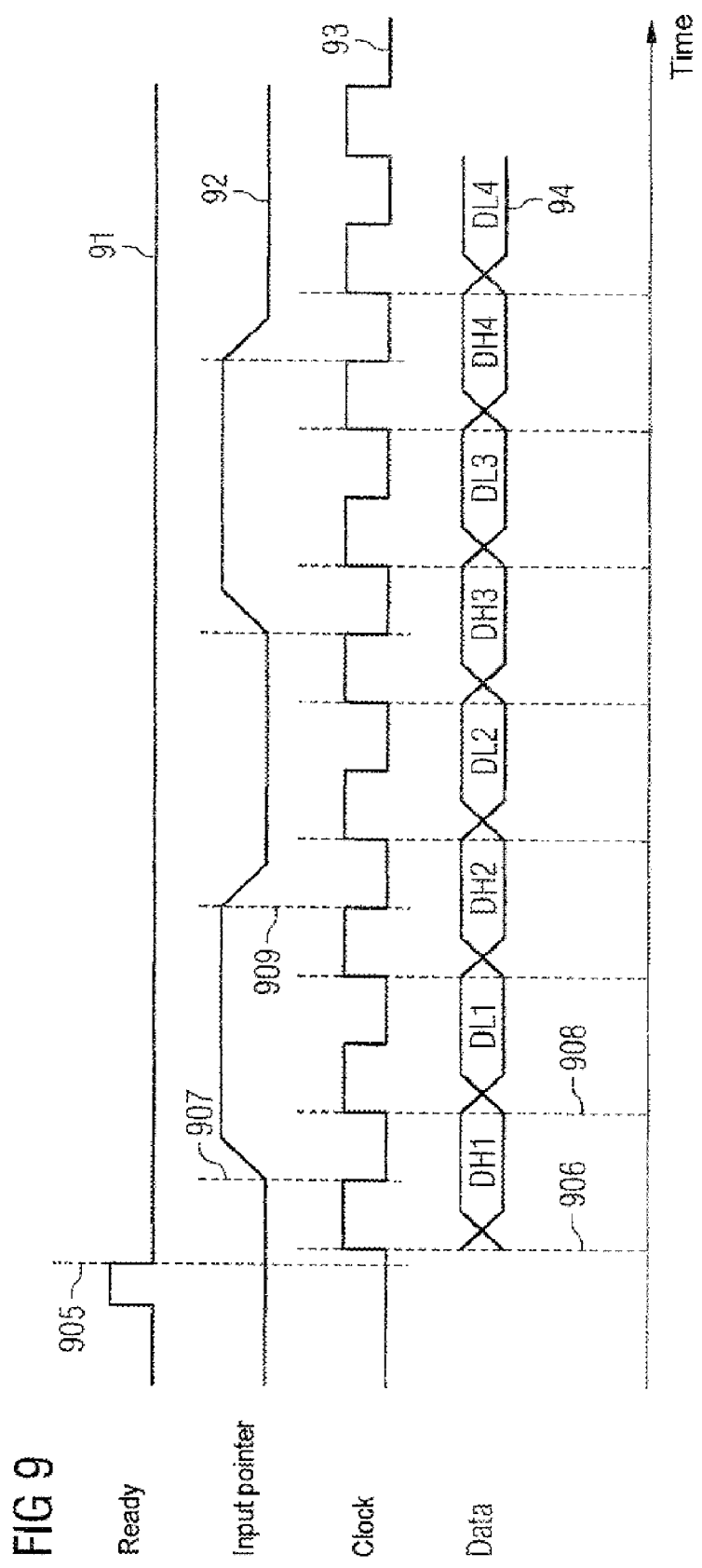
FIG. 9 diagrammatically shows a signal level variation with time according to a ninth embodiment of the present invention.

FIG. 9 diagrammatically shows the signal level variation with time according to a ninth embodiment of the present invention, particularly as can be used in a memory device according to the seventh embodiment of the present invention. Accordingly, a ready signal 91 signals only once the availability of data read out of the memory cell array. As shown here, this can take place at a time 905. According to this embodiment, the input pointer 92 is switched over periodically starting from this time 905—for example with in each case every second falling edge of the clock signal 93—and thus also at times 907 and 909. The ready signal 91 only needs to be delivered once at time 905 since the input pointer is then changed continuously. Analogously to the preceding embodiment, the data are output again in the form of two packets DHx and DLx as data signal 94 starting at a time 906. At time 906, that is to say at the time of the first rising edge of the clock signal 93 after the ready signal 91 at time 905, the high-value data word DH1 is thus output. One clock cycle later, at time 908, the low-value data word DL1 is then output. The control of the memory device can be advantageously arranged in a particularly simple manner since a single delivery of a ready signal initiates a periodic change in the input pointer and the data read out can be output in an automated manner on a time base with a predetermined time interval.

Figure 10:
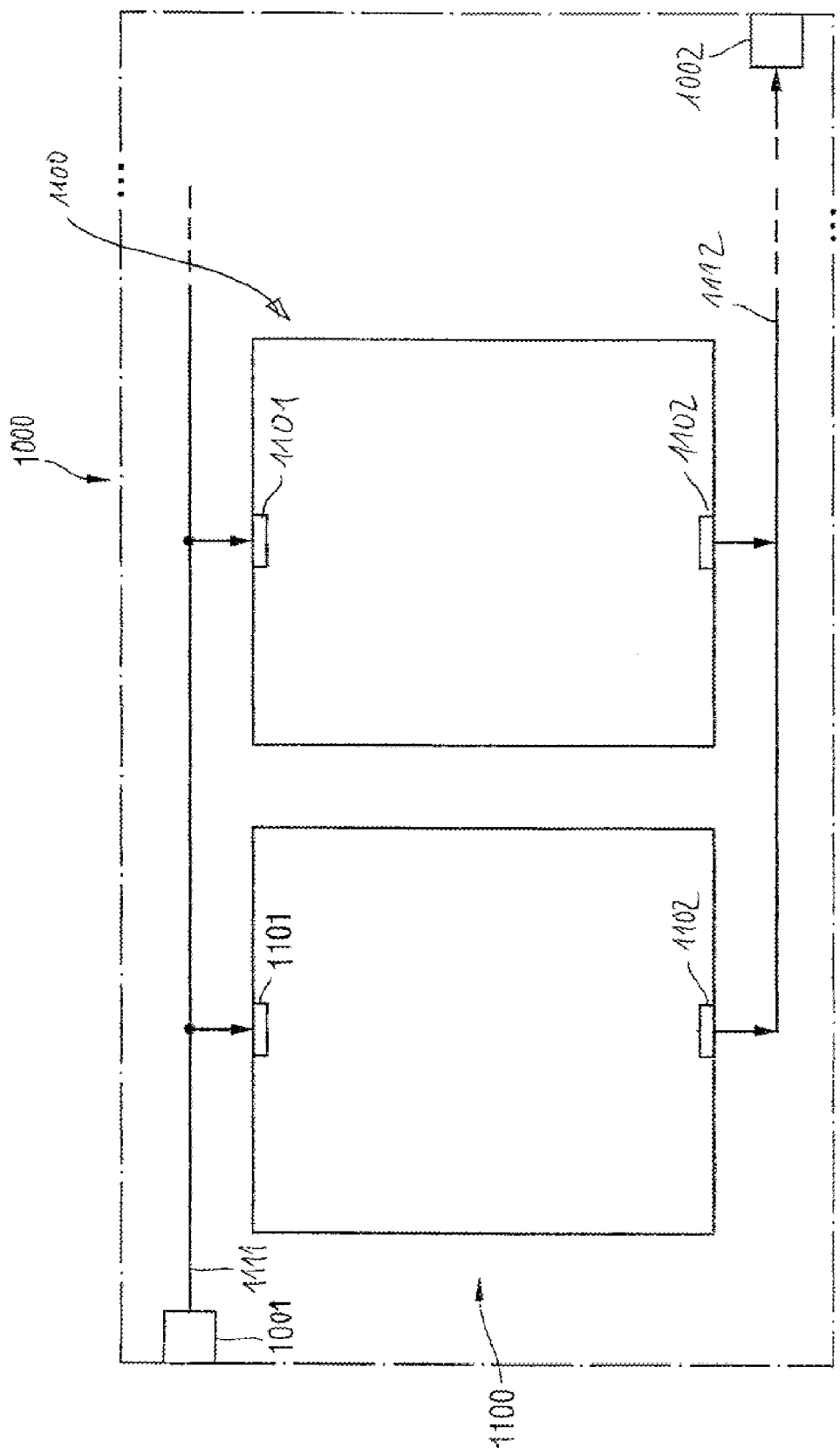
FIG. 10 diagrammatically shows a memory module according to a tenth embodiment of the present invention.

FIG. 10 shows a diagrammatic representation of a memory module 1000 comprising at least two memory devices 1100.

The memory devices 1100 may be understood as being one of the memory devices as they have been described in conjunction with the previous embodiments of the present invention. The memory module 1000 receives command data, e.g. from a memory controller or a microprocessor, via a command data input 1001. The command data are forwarded from the command data input 1001 via a first signal line 1111 to the memory devices 1100, and there to inputs 1101 of the memory devices 1100. The data read out, output by an output 1102 of the memory devices 1100, are forwarded to the data output 1002 of the memory module 1 via a second signal line 1112. The data read out are forwarded from there, for example to the memory controller, to the microprocessor or to another peripheral.

The preceding description only describes advantageous exemplary embodiments of the invention. The features disclosed therein and the claims and the drawings can, therefore, be essential for the realization of the invention in its various embodiments, both individually and in any combination. While the foregoing is directed to the embodiments of the present invention, other and further embodiments of this invention may be devised without departing from the basic scope of the invention, the scope of the present invention being determined by the claims that follow.

What is claimed is:

1. A memory device, comprising:
   a memory cell array;
   an input circuit configured to receive command data and provide drive signals to the memory cell array responsive to the command data;
   an output buffer configured to buffer data read out from the memory cell array responsive to the drive signals;
   an output configured to communicate with an external device; and
   a timer configured to drive the output buffer such that the buffered data are provided at the output after a predetermined time interval has elapsed, the predetermined time interval beginning with the provision of the drive signals,
   wherein the timer comprises a counter configured to count clock cycles after the provision of the drive signals.

2. The memory device as claimed in claim 1, wherein the command data is received as serial data and wherein input circuit comprises a parallelizing unit configured to parallelize the serial command data.

3. The memory device as claimed in claim 1, wherein the input circuit comprises a protocol unit configured to decode the command data for providing the drive signals.

4. The memory device as claimed in claim 1, wherein the input circuit comprises a transfer unit configured to forward the command data to a further output.

5. The memory device as claimed in claim 4, wherein the memory device comprises a further input and a further transfer unit, the further input configured to receive user data and the further transfer unit configured to forward the user data received from the further input to the output.

6. The memory device as claimed in claim 1, wherein the output buffer comprises a FIFO buffer.

7. The memory device as claimed in claim 1, wherein the input circuit is configured to provide the drive signals synchronously with a first clock signal.

8. The memory device as claimed in claim 7, wherein the counter is configured to count clock cycles of a second clock signal after the provision of the drive signals.

9. The memory device as claimed in claim 8, wherein the timer is configured to detect that the predetermined time interval has elapsed upon reaching a maximum value of the counter.

10. The memory device as claimed in claim 9, wherein the timer comprises a register configured to store the maximum value.

11. The memory device as claimed in claim 8, further comprising a synchronizing unit configured to synchronize the first clock signal and the second clock signal with respect to frequency and to phase.

12. A memory device, comprising:
    a memory cell array;
    an input circuit configured to receive command data and provide drive signals to the memory cell array responsive to the command data;
    an output buffer configured to buffer data read out from the memory cell array responsive to the drive signals; and
    an output configured to communicate with an external device, wherein the output buffer comprises a demultiplexer and at least two buffer registers, the demultiplexer configured to forward the read out data to one of the at least two buffer registers dependent on an input pointer.

13. The memory device as claimed in claim 12, wherein the output buffer comprises a control unit configured to provide the input pointer and the control unit further configured to change the input pointer dependent on a ready signal, the ready signal being provided by the memory cell array.

14. The memory device as claimed in claim 13, wherein a timer is configured to drive the output buffer such that the buffered data are provided at the output after a predetermined time interval has elapsed, the predetermined time interval beginning with the provision of the drive signals, the timer comprising a further control unit configured to provide an output pointer to the buffer registers, the buffer registers forwarding the buffered data to the output dependent on the output pointer.

15. The memory device as claimed in claim 12, wherein a timer is configured to drive the output buffer such that the buffered data are provided at the output after a predetermined time interval has elapsed, the predetermined time interval beginning with the provision of the drive signals, the timer comprising a control unit configured to provide the input pointer to the demultiplexer and to provide an output pointer to the buffer registers, the buffer registers forwarding the buffered data to the output dependent on the output pointer.

16. A memory module, comprising:
    at least two memory devices, each memory device comprising:
    a memory cell array;
    an input circuit configured to receive command data from an input and provide drive signals to the memory cell array;
    an output buffer configured to buffer data read out from the memory cell array responsive to the drive signals;
    an output configured to communicate with an external device; and
    a first signal line and a second signal line, the first signal line connecting the respective inputs of the memory devices and the second signal line connecting the respective outputs of the memory devices, wherein the respective output buffers of the memory devices comprises at least two buffer registers, wherein one of the at least two buffer registers stores the read out data dependent on an input pointer.

17. The memory module as claimed in claim 16, wherein each input circuit comprises a protocol unit configured to decode the command data for providing the drive signals of the respective memory device.

18. The memory module as claimed in claim 16, wherein each input circuit comprises a transfer unit configured to forward the command data to a further output of the respective memory device.

19. The memory module as claimed in claim 18, wherein the memory devices each further comprise a further input and a further transfer unit, the further input configured for receiving user data and the further transfer unit configured for forwarding the user data received from the further input to the output.

20. The memory module as claimed in claim 16, wherein the respective output buffers of the memory devices comprise a control unit configured for providing the input pointer and changing the input pointer dependent on a ready signal, the ready signal being provided by the memory cell array.

21. The memory module as claimed in claim 20, wherein a further control unit is configured for providing an output pointer to the buffer registers, the buffer registers forwarding the buffered data to the output dependent on the output pointer.

22. The memory module as claimed in claim 21, wherein a control unit is configured for providing the input pointer to a demultiplexer, the demultiplexer being configured to forward the read out data to one of the at least two buffer registers dependent on the input pointer, the control unit being further configured for providing an output pointer to the buffer registers, the buffer registers forwarding the buffered data to the output dependent on the output pointer.

23. A memory module comprising:
at least two memory devices, each memory device comprising:
a memory cell array;
an output buffer configured to buffer data read out from the memory cell array responsive to drive signals;
an output configured to communicate with an external device;
a timer configured drive the output buffer such that the buffered data are provided at the output after a predetermined time interval has elapsed, the predetermined time interval beginning with the provision of the drive signals; and
a signal line connecting the respective outputs of the memory devices,
wherein the respective timers of the memory devices comprise a counter configured for counting clock cycles after the provision of the drive signals.

24. The memory module as claimed in claim 23, wherein the respective timers of the memory devices are configured for detecting that the predetermined time interval has elapsed on reaching a maximum value of the counter.

25. The memory module as claimed in claim 24, wherein the respective timers of the memory devices comprise a register configured for storing the maximum value.

26. A method of operating a memory device, the method comprising:
receiving command data at an input of the memory device;
issuing drive signals to a memory cell array of the memory device, the drive signals depending on the command data;
buffering data read out from the memory cell array in a data buffer of the memory device; and
outputting the buffered data to an output of the memory device after a predetermined time interval has elapsed, the predetermined time interval beginning with the provision of the drive signals,
wherein the predetermined time interval is determined by counting clock cycles.

27. The method as claimed in claim 26, wherein the command data is serial command data and further comprising parallelizing the serial command data.

28. The method as claimed in claim 26, further comprising decoding the command data for providing the drive signals.

29. The method as claimed in claim 26, further comprising forwarding the command data to a further output of the memory device.

30. The method as claimed in claim 29, further comprising forwarding user data from a further input of the memory device to the output.

31. The method as claimed in claim 26, further comprising:
changing an input pointer, the changing of the input pointer being dependent on the availability of the data read out from the memory cell array; and
setting a buffer register of memory device, the setting of the buffer register being dependent on the input pointer, the buffer register buffering the data read out from the memory cell array.

32. The method as claimed in claim 31, wherein the buffered data is outputted dependent on an output pointer, the output pointer being changed after the predetermined time interval has elapsed.

33. The method as claimed in claim 26, wherein the drive signals is provided synchronously with a first clock signal.

34. The method as claimed in claim 33, wherein the predetermined time interval is determined by counting clock cycles of a second clock signal after the provision of the drive signals.

35. The method as claimed in claim 34, further comprising synchronizing the first clock signal and the second clock signal with respect to frequency and to phase.

* * * * *